(12) United States Patent
Kawaguchi et al.

(10) Patent No.: US 9,990,017 B2
(45) Date of Patent: Jun. 5, 2018

(54) ELECTRONIC DEVICE AND METHOD OF INITIALIZING CONTROLLER OF ELECTRONIC DEVICE

(71) Applicant: SEIKO EPSON CORPORATION, Tokyo (JP)

(72) Inventors: Takashi Kawaguchi, Nagano (JP); Shinji Nakamiya, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 178 days.

(21) Appl. No.: 15/041,411

(22) Filed: Feb. 11, 2016

(65) Prior Publication Data

US 2016/0282817 A1 Sep. 29, 2016

(30) Foreign Application Priority Data

Mar. 25, 2015 (JP) ................................ 2015-063355

(51) Int. Cl.
*G06F 1/24* (2006.01)
*G04G 19/10* (2006.01)
*G06F 1/26* (2006.01)
*H03K 17/22* (2006.01)
*G04C 10/02* (2006.01)

(52) U.S. Cl.
CPC .............. *G06F 1/24* (2013.01); *G04G 19/10* (2013.01); *G06F 1/263* (2013.01); *H03K 17/22* (2013.01); *G04C 10/02* (2013.01)

(58) Field of Classification Search
None
See application file for complete search history.

(56) References Cited

U.S. PATENT DOCUMENTS

| 7,660,975 B2 | 2/2010 | Nakamura et al. |
| 9,041,355 B2* | 5/2015 | Ishibashi ............. B60L 11/1842 320/104 |
| 2003/0146736 A1 | 8/2003 | Kosuda et al. |
| 2013/0214606 A1* | 8/2013 | Hasebe .............. G03G 15/5004 307/80 |
| 2015/0236523 A1* | 8/2015 | Takano .................. H02J 7/007 320/107 |

FOREIGN PATENT DOCUMENTS

| EP | 1662357 A2 | 5/2006 |
| JP | 2006-153669 A | 6/2006 |

OTHER PUBLICATIONS

The Extended European Search Report for the corresponding European Application No. 16161939.0 dated Aug. 23, 2016.

* cited by examiner

*Primary Examiner* — Thienvu Tran
*Assistant Examiner* — David M Stables (57) ABSTRACT

An electronic device that has a secondary battery and a controller which receives power supply from the secondary battery so as to perform a drive control on one or other multiple circuits driven by receiving the power supply from the secondary battery includes an initializing unit that starts processing for outputting an initializing signal to instruct the controller to perform initializing at predetermined timing, in response to a starting point in which a voltage of the secondary battery becomes equal to or lower than a first threshold voltage which is set to be higher than an operation-guaranteed voltage of the controller and a lower state thereof continues for a predetermined period of time.

9 Claims, 9 Drawing Sheets

ELECTRONIC DEVICE AND METHOD OF INITIALIZING CONTROLLER OF ELECTRONIC DEVICE

BACKGROUND

1. Technical Field

The present invention relates to an electronic device which uses a secondary battery.

2. Related Art

For example, an electronic device which uses a secondary battery as a power source, such as an electronic timepiece including a solar cell (hereinafter, referred to as a "solar timepiece"), has been generally and widely used. If this type of electronic device is driven in a state where the electronic device is left in a dark place without charging the secondary battery, a power supply voltage is gradually reduced. If the power supply voltage in this type of electronic device falls below a lower limit value of a voltage which guarantees a normal operation (hereinafter, referred to as an operation-guaranteed voltage) for a controller such as a Central Processing Unit (CPU), a normal control cannot be performed, thereby bringing the electronic device into a runaway state in some cases. Even when charging for the power source and power consumption are performed in parallel, if a state continues where a charging current falls below a consumed current, there is also a possibility that the electronic device may be brought into the runaway state. In addition, when the charging for the power source and the power consumption are performed in parallel, the charging and the power consumption cause the power supply voltage to pulsate over the operation-guaranteed voltage, thereby causing a possibility that the occurrence of the runaway state and restoring from the runaway state may be repeated. Various techniques for preventing this repetition of the occurrence of the runaway state and the restoring from the runaway state (hereinafter, referred to as "continuation of the runaway state") have been proposed in the related art. As an example, JP-A-2006-153669 discloses a technique. According to the technique disclosed in JP-A-2006-153669, when the power supply voltage falls below a voltage which is set to be higher than the operation-guaranteed voltage (hereinafter, referred to as a set voltage), a system is initialized by cyclically outputting an initializing signal for instructing the CPU to perform initializing, thereby preventing the continuation of the runaway state.

However, according to the technique disclosed in JP-A-2006-153669, when the power supply voltage falls below the set voltage due to a temporarily decreased voltage which is caused by a heavy load, the initializing signal is output, thereby causing a possibility that the system may be inadvertently initialized. For example, when the technique disclosed in JP-A-2006-153669 is applied to an alarm-installed solar timepiece, there is a disadvantage in that the system is initialized due to a temporarily decreased voltage which is caused by alarm sounding.

SUMMARY

An advantage of some aspects of the invention is to provide a technique which prevents continuation of a runaway state while avoiding a system from being inadvertently initialized due to a temporarily decreased voltage in an electronic device which uses a secondary battery.

An aspect of the invention provides an electronic device including a secondary battery, a controller that receives power supply from the secondary battery so as to perform a drive control on one or other multiple circuits which are driven by receiving the power supply from the secondary battery, and an initializing unit that starts processing for outputting an initializing signal to instruct the controller to perform initializing at predetermined timing, in response to a starting point in which a voltage of the secondary battery becomes equal to or lower than a first threshold voltage which is set to be higher than an operation-guaranteed voltage of the controller and a lower state thereof continues for a predetermined period of time, and that stops the outputting of the initializing signal, in response to a starting point in which the voltage of the secondary battery becomes equal to or higher than a second threshold voltage which is set to be higher than the operation-guaranteed voltage of the controller.

According to the electronic device, even when the voltage of the secondary battery becomes equal to or lower than the first threshold voltage since any one of one or other multiple circuits is driven, if the time length of the period while the voltage of the secondary battery falls below the first threshold voltage is shorter than the predetermined period of time, the initializing signal is not output. Therefore, even when the voltage of the secondary battery temporarily falls below the first threshold voltage since any one of one or other multiple circuits is driven, there is no possibility of inadvertent initializing. In addition, in the electronic device according to the aspect of the invention, until the voltage of the secondary battery becomes equal to or higher than the second threshold voltage, the processing for outputting the initializing signal at the predetermined timing is continuously performed. Therefore, it is possible to prevent continuation of a runaway state.

As another aspect of the invention, the invention may be conceived as a method of initializing a controller in an electronic device which has a secondary battery, one or other multiple circuits driven by receiving power supply from the secondary battery, and the controller for performing a drive control on the one or other multiple circuits by receiving the power supply from the secondary battery. The method includes starting processing for outputting an initializing signal to instruct the controller to perform initializing at predetermined timing, in response to a starting point in which a voltage of the secondary battery becomes equal to or lower than a first threshold voltage which is set to be higher than an operation-guaranteed voltage of the controller and a lower state thereof continues for a predetermined period of time, and stopping the outputting of the initializing signal, in response to a starting point in which the voltage of the secondary battery becomes equal to or higher than a second threshold voltage which is set to be higher than the operation-guaranteed voltage of the controller. In this case, it is possible to prevent continuation of a runaway state while avoiding a system from being inadvertently initialized due to a temporarily decreased voltage.

In the aspects of the invention, the first threshold voltage is a threshold in a phase where the voltage of the secondary battery falls, and the second threshold voltage is a threshold in a phase where the voltage of the secondary battery rises. Therefore, preferably, the second threshold voltage is set to be equal to or greater than the first threshold voltage.

In a preferred aspect of the invention, the controller stops driving of a predetermined circuit within one or other multiple circuits, in response to a starting point in which the voltage of the secondary battery falls below the first threshold voltage. According this aspect, since power consumption is suppressed after the voltage of the secondary battery falls below the first threshold voltage, it is possible to shorten the time required until a normal operation is restored. In another preferred aspect of the invention, the controller stops driving of a predetermined circuit within one or other multiple circuits, in response to a starting point in which the voltage of the secondary battery falls below a third threshold voltage which is set to be higher than the first threshold voltage. According to this aspect, it is possible to maintain a normal operation state for a long time by lengthening the time required until the voltage of the secondary battery falls below the first threshold voltage.

In another preferred aspect of the invention, a threshold voltage (fourth threshold voltage) when the electronic device starts to be operated or after a system is initialized may be set, and the initializing unit may perform a process for outputting the initializing signal at predetermined timing, when the electronic device starts to be operated or after the system is initialized, until the voltage of the secondary battery rises over the fourth threshold voltage. As a matter of course, it is necessary to set the fourth threshold voltage to be higher than the operation-guaranteed voltage of the controller. The fourth threshold voltage may be different from both the first and second threshold voltages. The fourth threshold voltage may be equal to at least one of the first threshold voltage and the second threshold voltage. If the fourth threshold voltage is set to be different from the second threshold voltage, whether or not the controller needs to be initialized can be flexibly determined by using different threshold voltages for a voltage increasing phase and the subsequent voltage increasing phase when the operation starts or after the system is initialized.

In another preferred aspect of the invention, more preferably, the predetermined period of time is set to be shorter than a period of time during which the voltage of the secondary battery decreases from the first threshold voltage to the operation-guaranteed voltage, when the electronic device is operated in a state where power is not supplied to the secondary battery. The reason is to reliably prevent a runaway state of the controller which is caused by a decreased voltage of the secondary battery.

In another preferred aspect of the invention, the electronic device further includes a watchdog timer that initializes a system in response to a starting point where a predetermined time is measured, and the initializing unit resets time measurement of the watchdog timer at predetermined timing when the voltage of the secondary battery is higher than the first threshold voltage, whereas the initializing unit suspends the resetting for the time measurement of the watchdog timer, when a state where the voltage of the secondary battery is equal to or lower than the first threshold voltage continues for the predetermined period of time or longer. The watchdog timer is often disposed in the electronic device such as electronic timepieces in order to avoid a runaway state of software. In this case, by using the watchdog timer disposed in the electronic device, it is possible to prevent continuation of a runaway state while avoiding a system from being inadvertently initialized due to a temporarily decreased voltage in the electronic device which uses the secondary battery.

In another preferred aspect of the invention, the electronic device includes a voltage generator and a switch which are interposed and inserted in parallel between the former of high-potential side and low-potential side power supply lines for supplying power to the one or other multiple circuits and the controller, and a high-potential side terminal of the secondary battery, and the initializing unit turns off the switch in response to a starting point where the outputting of the initializing signal starts, the initializing unit may turn on the switch in response to a starting point where the outputting of the initializing signal stops, and compares the voltage of the secondary battery with the second threshold voltage, in such a way that a potential difference between the high-potential side and the low-potential side power supply lines is regarded as the voltage of the secondary battery. Specific examples of the voltage generator include diodes or resistors, and specific examples of the switch include transistor switches. According to this aspect, a potential difference between the high-potential side power supply line and the low-potential side power supply line coincides with the voltage of the high-potential side terminal of the secondary battery in a state where the switch is turned on, and coincides with a voltage obtained by adding a voltage generated by the voltage generator (voltage corresponding to voltage decreased due to a fact that a current flows into the secondary battery through a diode) to the voltage of the high-potential side terminal of the secondary battery in a state where the switch is turned off. That is, according to this aspect, the second threshold voltage and a comparison-target voltage are increased by the voltage generator. Therefore, it is possible to shorten the time required until a normal operation is restored.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the drawings.

A: First Embodiment

A-1: Configuration

Figure 1:
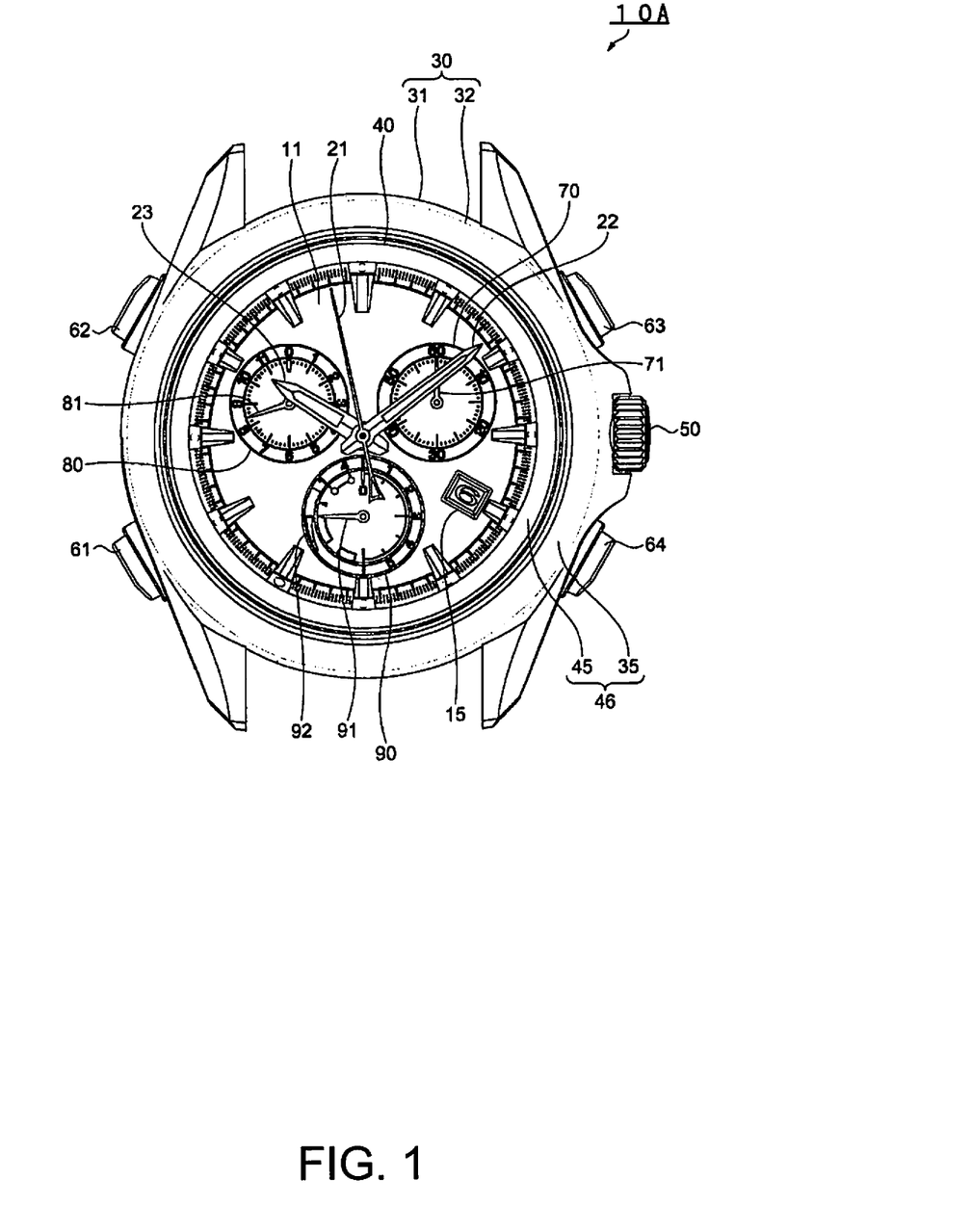
FIG. 1 is a plan view illustrating an outer shape of an electronic timepiece according to a first embodiment of an electronic device according to the invention.
Figure 2:
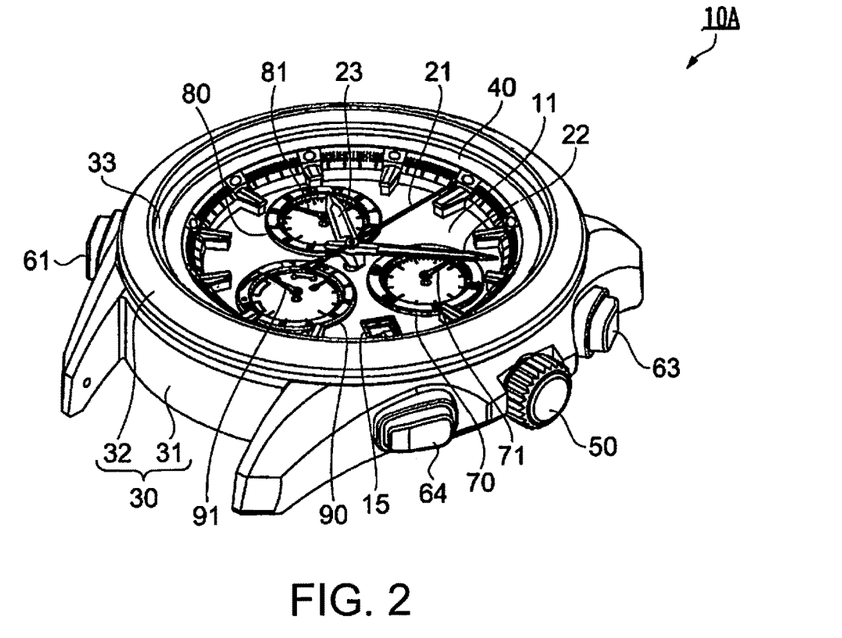
FIG. 2 is a perspective view illustrating the outer shape of the electronic timepiece.
Figure 3:
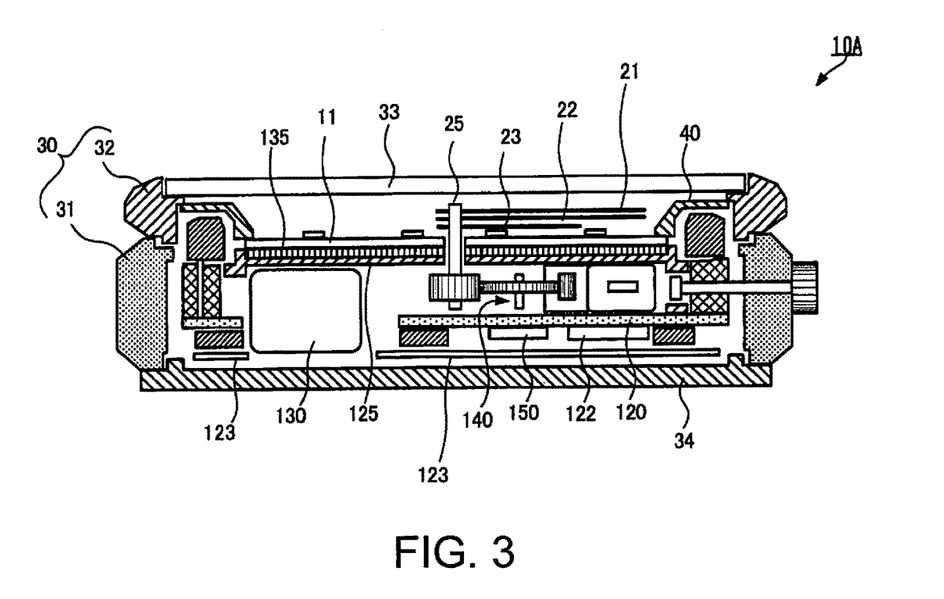
FIG. 3 is a sectional view illustrating a cross section of the electronic timepiece.

FIG. 1 is a plan view illustrating an outer shape of an electronic timepiece 10A according to a first embodiment of an electronic device according to the invention. FIG. 2 is a perspective view illustrating the outer shape of the electronic timepiece 10A. The electronic timepiece 10A is a multi-functional alarm-installed solar timepiece provided with an alarm sounding function and a stopwatch function. As illustrated in FIGS. 1 to 3, the electronic timepiece 10A includes an exterior case 30, a cover glass 33, and a case back 34. The exterior case 30 is configured so that a ceramic-made bezel 32 is fitted to a metal-made and cylindrical case 31. A disc-shaped dial 11 serving as a time display section is arranged on an inner peripheral side of the bezel 32 via a plastic-made and ring-shaped dial ring 40.

The dial 11 includes indicating hands 21, 22, and 23. The dial 11 has a circular first small window 70 and an indicating hand 71 in the direction toward 2 o'clock from the center, a circular second small window 80 and an indicating hand 81 in the direction toward 10 o'clock from the center, a circular third small window 90 and an indicating hand 91 in the direction toward 6 o'clock from the center, and a rectangular small calendar window 15 in the direction toward 4 o'clock from the center. The dial 11, the indicating hands 21, 22, and 23, the first small window 70, the second small window 80, the third small window 90, and the small calendar window 15 are visible through the cover glass 33.

A crescent-shaped symbol 92 whose base end is thick in the direction toward 9 o'clock and tip end is thin in the direction toward 7 o'clock is marked along the circumference on the outer periphery of the third small window 90 in a range from the direction toward 7 o'clock to the direction toward 9 o'clock. The symbol 92 is a power indicator of a secondary battery 130 (refer to FIG. 3). Depending on residual capacity of the battery, the indicating hand 91 indicates any one of the base end, the tip end, and an intermediate portion.

An A-button 61 at a position in the direction toward 8 o'clock from the center of the dial 11, a B-button 62 at a position in the direction toward 10 o'clock, a C-button 63 at a position in the direction toward 2 o'clock, a D-button 64 at a position in the direction toward 4 o'clock, and a crown 50 at a position in the direction toward 3 o'clock are disposed on a side surface of the exterior case 30. The A-button 61, the B-button 62, the C-button 63, the D-button 64, and the crown 50 are operated so as to output an operation signal in accordance with an operation.

As illustrated in FIG. 3, in the electronic timepiece 10A, a front surface side opening within two openings of the metal-made exterior case 30 is closed by the cover glass 33 via the bezel 32, and a rear surface side opening is closed by the metal-made case back 34. The inner side of the exterior case 30 is provided with the dial ring 40 which is attached to the inner periphery of the bezel 32, the light-transmitting dial 11, an indicating hand axle 25 which penetrates the dial 11, the indicating hands 21, 22, and 23 which turn around the indicating hand axle 25, and a drive mechanism 140 which drives the indicating hands 21, 22, and 23. The indicating hand axle 25 passes through the center of the exterior case 30 in a plan view, and is disposed along the central axis extending in the forward and rearward direction.

The dial 11 is a circular plate member which displays the time on the inside of the exterior case 30, is formed of a light-transmitting material such as plastic, includes the indicating hands 21, 22, and 23 between the cover glass 33 and the dial 11, and is arranged on the inside of the dial ring 40.

A solar panel 135 for photovoltaic generation is provided between the dial 11 and a main plate 125 to which the drive mechanism 140 is attached. The solar panel 135 is a circular flat plate in which multiple solar cells (photovoltaic elements) for converting light energy into electrical energy (power) are connected in series. In addition, the solar panel 135 also has a function to detect sunlight. The dial 11, the solar panel 135, and the main plate 125 have penetrating holes for the indicating hand axle 25 and a indicating hand axle (not illustrated) of the indicating hand 71 of the first small window 70, the indicating hand 81 of the second small window 80, and the indicating hand 91 of the third small window 90, and have an opening for the small calendar window 15.

The drive mechanism 140 is attached to the main plate 125, and is covered with a circuit board 120 from the rear surface side. The drive mechanism 140 has a train wheel such as a stepping motor (hereinafter, referred to as a "motor") and a gear. The motor rotates the indicating hand axle 25 via the train wheel, thereby rotating the indicating hands 21, 22, and 23. In addition, the indicating hand 71 of the first small window 70, the indicating hand 81 of the second small window 80, and the indicating hand 91 of the third small window 90 which are illustrated in FIGS. 1 and 2 also have the similar drive mechanism (not illustrated), thereby driving the respective indicating hands 71, 81, and 91.

The circuit board 120 includes a control display unit 150 and the secondary battery 130 such as a lithium-ion battery. The secondary battery 130 is charged with power generated by the solar panel 135. A circuit holder 123 is disposed below the circuit board 120.

Figure 4:
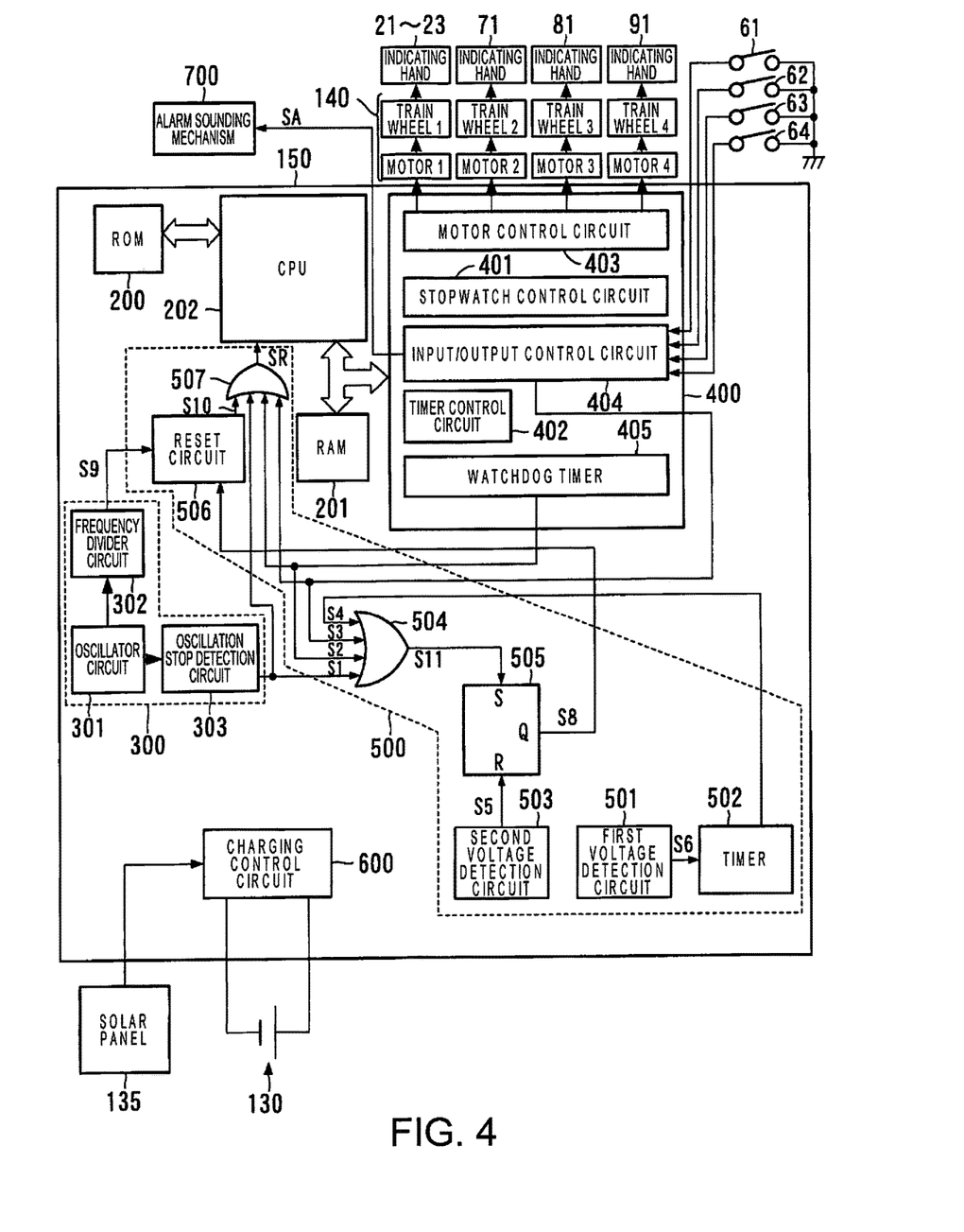
FIG. 4 is a block diagram illustrating an example of an electrical configuration of the electronic timepiece.

FIG. 4 is a block diagram illustrating an electronic circuit disposed in the circuit board 120, that is, an electrical configuration example of the electronic timepiece 10A. FIG. 4 illustrates the secondary battery 130 which is disposed in the circuit board 120 and the control display unit 150 which is operated by receiving power from the secondary battery 130. In addition, FIG. 4 illustrates the solar panel 135, the indicating hands 21 to 23, and the drive mechanism 140, the indicating hand 71 and the drive mechanism, the indicating hand 81 and the mechanism, the indicating hand 91 and the drive mechanism, the A-button 61, the B-button 62, the C-button 63, the D-button 64, and an alarm sounding mechanism 700. The alarm sounding mechanism 700 sounds an alarm in accordance with an alarm sounding signal SA supplied from the control display unit 150.

As illustrated in FIG. 4, the control display unit 150 includes a ROM 200, a RAM 201, a CPU 202, a clock signal generation circuit 300, a peripheral circuit 400, an initializing circuit 500, and a charging control circuit 600. The charging control circuit 600 is a circuit for charging the secondary battery 130 with power generated by the solar panel 135. The Read Only Memory (ROM) 200 previously stores programs to be executed by the CPU 202 to perform a time measurement operation and a control for each unit. Data such as the current time and the measured time of a stopwatch control circuit 401 is written on the Random Access Memory (RAM) 201. The CPU 202 executes the programs stored in the ROM 200, thereby functioning as a controller for controlling each unit of the electronic timepiece 10A.

The clock signal generation circuit 300 includes an oscillator circuit 301, a frequency divider circuit 302, and an oscillation stop detection circuit 303. The oscillator circuit 301 receives power supply from the secondary battery 130, and generates a clock signal having a frequency (for example, 32 kHz) determined by a crystal oscillator (not illustrated in FIG. 4) connected to an external terminal, irrespective of the CPU 202 in operation and in stopped operation, thereby supplying the clock signal to the frequency divider circuit 302. An oscillation starting voltage of the oscillator circuit 301 is a voltage VSTA which is lower than an operation-guaranteed-voltage VMIN of the CPU 202. If a voltage equal to or higher than the oscillation starting voltage VSTA is applied to the oscillator circuit 301, the oscillator circuit 301 starts to output the clock signal. The CPU 202 and circuits other than the oscillator circuit 301 within circuits configuring the control display unit 150 are operated by using a voltage which is lower than the oscillation starting voltage VSTA.

The frequency divider circuit 302 divides the clock signal input from the oscillator circuit 301, and supplies a frequency-divided signal (pulse) S9 having a predetermined frequency to the initializing circuit 500. Although details are not illustrated in FIG. 4, the frequency divider circuit 302 also supplied the frequency-divided signal to the peripheral circuit 400.

The oscillation stop detection circuit 303 monitors the presence or absence of oscillation in the oscillator circuit 301. The oscillation stop detection circuit 303 supplies an oscillation stop signal S1 in an H-level to the initializing circuit 500 while the oscillation stops, and supplies the oscillation stop signal S1 in an L-level to the initializing circuit 500 if the oscillation starts.

The peripheral circuit 400 is a set of circuits whose drive is controlled by the CPU 202, and includes the stopwatch control circuit 401, a timer control circuit 402, a motor control circuit 403, an input/output control circuit 404, and a watchdog timer 405. A function and role of each circuit included in the peripheral circuit 400 is not particularly changed from those of the electronic timepiece in the related art. A schematic configuration is as follows.

Both the stopwatch control circuit 401 and the timer control circuit 402 are counters for counting pulses supplied from the frequency divider circuit 302. The stopwatch control circuit 401 starts or stops a counting operation, based on flag information stored in a predetermined region of a peripheral circuit controlling register (not illustrated in FIG. 4). When performing the counting operation, the stopwatch control circuit 401 generates an interrupt signal every $1/100$ seconds, every $1/10$ seconds, and every second, irrespective of the CPU 202 in operation and in stopped operation. The timer control circuit 402 also starts or stops the counting operation, based on the flag information stored in the predetermined region of the peripheral circuit controlling register. When performing the counting operation, the timer control circuit 402 generates the interrupt signal every second, irrespective of the CPU 202 in operation and in stopped operation.

The motor control circuit 403 generates a drive signal for performing a drive control on the motor, based on the flag information etc. stored in the peripheral circuit controlling register, and supplies the drive signal to the drive mechanism 140. The input/output control circuit 404 uploads each opening and closing data of the A-button 61, the B-button 62, the C-button 63, and the D-button 64. When the uploaded data indicates a predetermined reset operation (for example, a simultaneous operation of multiple buttons), the input/output control circuit 404 outputs a signal S3 in an H-level to an OR gate 504 and an OR gate 507. The signal S3 is a manual reset signal which means manual reset. In addition, the input/output control circuit 404 also performs processing for generating an interrupt signal in accordance with the uploaded data.

The watchdog timer 405 initializes a system when the CPU 202 runs away while a program is executed. The watchdog timer 405 measures the time for a predetermined period of time (3 seconds in the embodiment). If the system is not reset at a time point where the predetermined period of time elapses, the watchdog timer 405 outputs a differential signal S2 at the time point where the predetermined period of time elapses. In the embodiment, the program executed by the CPU 202 has preloaded algorithm for resetting the watchdog timer 405 within a cycle which is shorter than the predetermined period of time. Therefore, if the CPU 202 is brought into a runaway state while the program is executed, the watchdog timer 405 is not reset. At a time point where the predetermined period of time elapses from when the time measurement starts, the watchdog timer 405 outputs the differential signal S2.

The initializing circuit 500 includes a first voltage detection circuit 501, a timer 502, a second voltage detection circuit 503, the OR gate 504, an SR latch 505, a reset circuit 506, and the OR gate 507. The initializing circuit 500 functions as an initializing unit for initializing the CPU 202. The initializing circuit 500 starts processing for cyclically outputting an initializing signal SR which instructs the CPU 202 to perform initializing, in response to a starting point where a voltage VDD of the secondary battery 130 becomes equal to or lower than a first threshold voltage V1 which is set to be higher than the operation-guaranteed voltage VMIN of the CPU 202 and where the state continues for a predetermined period of time T2. The initializing circuit 500 stops the outputting of the initializing signal SR, in response to a starting point where the voltage VDD of the secondary battery 130 becomes equal to or higher than a second threshold voltage V2 which is set to be higher than the operation-guaranteed voltage VMIN (in the embodiment, V1<V2).

In the embodiment, the second threshold voltage V2 is set to be higher than the first threshold voltage V1. However, as a matter of course, labor needed to set the threshold voltages may be reduced by setting both the threshold voltages to be the same as each other. In addition, the time length of the predetermined period of time T2 may be determined to have a suitable value through appropriate experiments. In the embodiment, the time length of the predetermined period of time T2 is set to be shorter than a period of time during which the voltage VDD of the secondary battery 130 is decreased from the first threshold voltage V1 to the operation-guaranteed voltage VMIN when the electronic timepiece 10A is operated in a state where power is not supplied to the secondary battery 130. The reason is to reliably prevent a runaway state.

The first voltage detection circuit 501 compares magnitudes between the voltage VDD of the secondary battery 130 and the first threshold voltage V1, and supplies a signal S6 corresponding to the comparison result to the timer 502. Whereas the first voltage detection circuit 501 outputs the signal S6 in an H-level in a case of VDD≤V1, the first voltage detection circuit 501 outputs the signal S6 in an H-level in a case of VDD>V1.

The timer 502 starts time measurement in response to a starting point where the signal S6 is switched over from the H-level to the L-level, and stops the time measurement by resetting the measured time in response to a starting point where the signal S6 is switched over from the L-level to the H-level. The timer 502 supplies a differential signal S4 to the OR gate 504 in response to a starting point where the measured time reaches the predetermined period of time T2.

The second voltage detection circuit 503 compares magnitudes between the voltage VDD of the secondary battery 130 and the second threshold voltage V2, and supplies a signal S5 corresponding to the comparison result to a reset terminal (illustrated by the reference numeral "R" in FIG. 4) of the SR latch 505. Whereas the second voltage detection circuit 503 outputs the signal S5 in an L-level in a case of VDD≤V2, the second voltage detection circuit 503 outputs the signal S5 in an H-level in a case of VDD>V2.

An oscillation stop signal S1, a signal S2 (differential signal output from the watchdog timer 405), a signal S3 (manual reset signal output from the input/output control circuit 404), and a signal S4 (differential signal output from the timer 502) are supplied to the OR gate 504. The OR gate 504 generates the signals S1, S2, S3, and S4, and an OR signal S11, and supplies these signals to a set terminal (illustrated by the reference numeral "S" in FIG. 4) of the SR latch 505. The SR latch 505 is set by the signal S11, and supplies a signal S8 in an H-level to the reset circuit 506. The SR latch 505 is reset by the signal S5 (signal output from the second voltage detection circuit 503), and supplies a signal S8 in an L-level to the reset circuit 506.

The reset circuit 506 outputs a differential signal S10 to the OR gate 507 while the signal S8 is in an H-level and when a clock signal S9 falls. The oscillation stop signal S1, the signal S2, the signal S3, and the signal S10 are supplied to the OR gate 507. The OR gate 507 supplies an OR signal of the signal S1, the signal S2, the signal S3, and the signal S10 to the CPU 202, as the initializing signal SR.

Hitherto, the configuration of the electronic timepiece 10A has been described.

A-2: Operation

Next, an operation of the electronic timepiece 10A will be described with reference to FIGS. 5 and 6.

Figure 5:
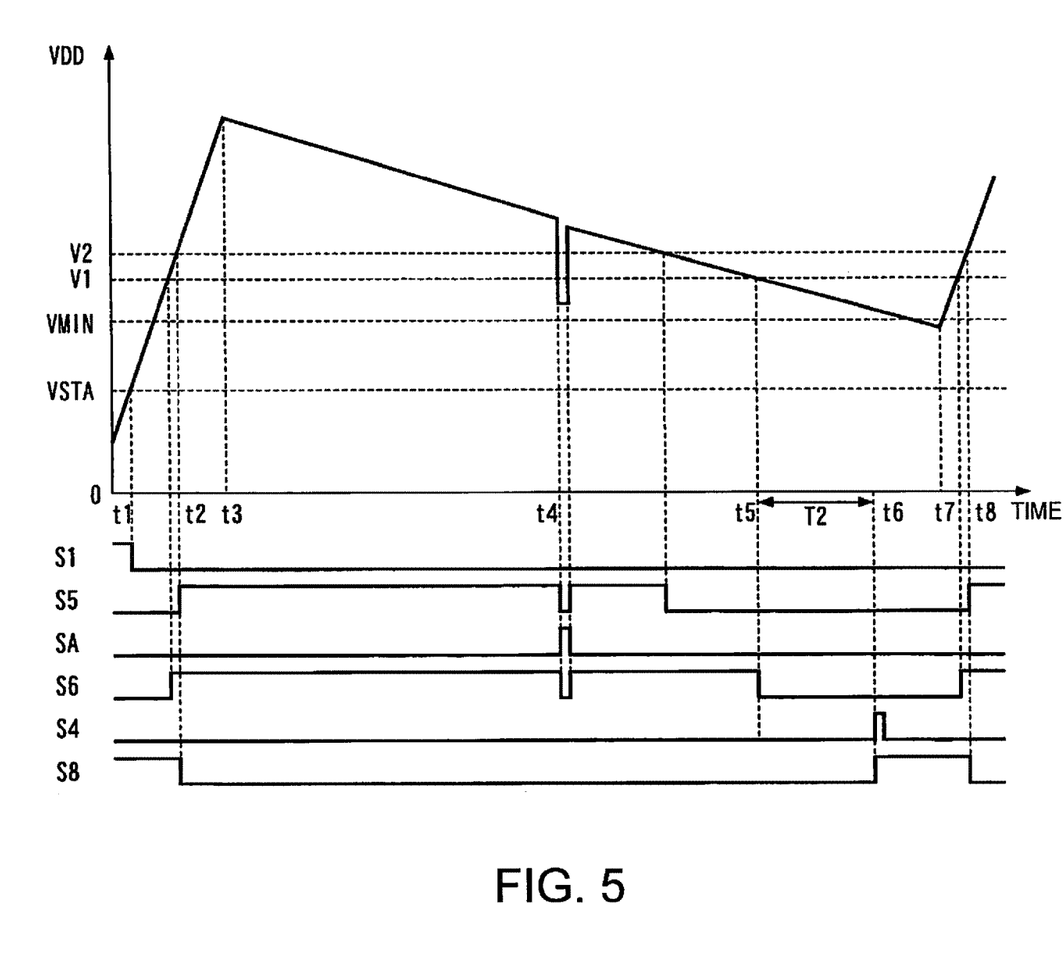
FIG. 5 is a timing chart illustrating an operation of the electronic timepiece.
Figure 6:
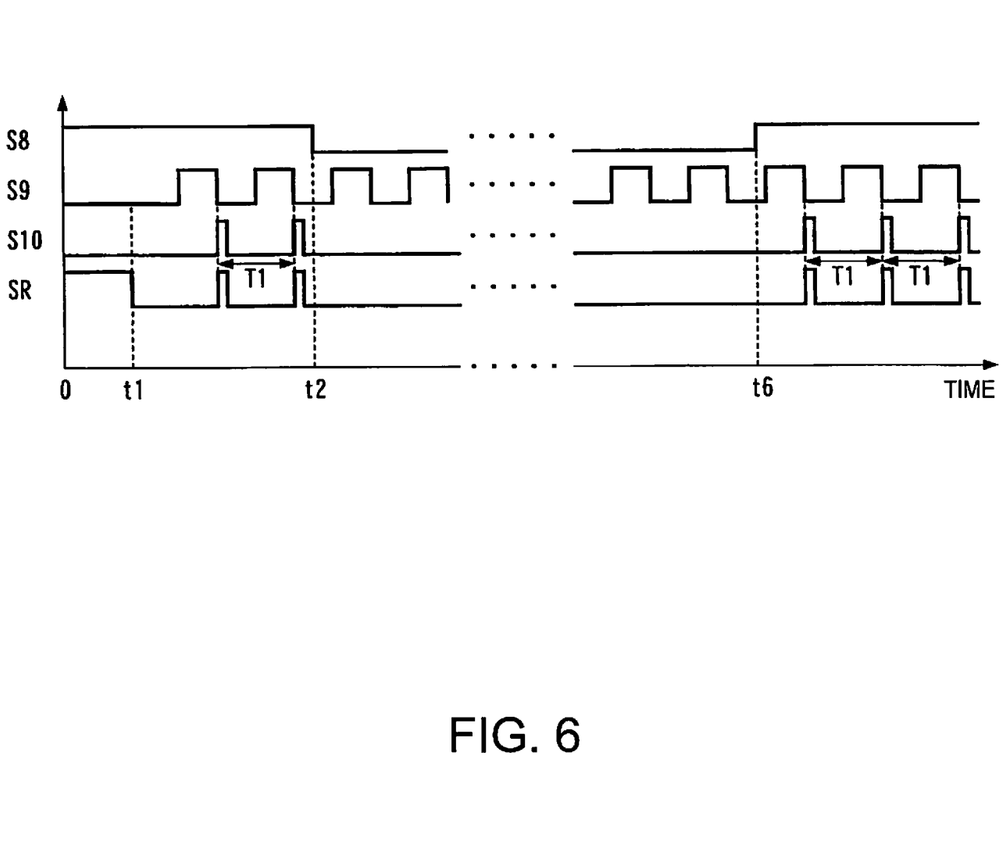
FIG. 6 is a timing chart illustrating an operation of the electronic timepiece.

FIG. 5 is a timing chart illustrating an operation of the electronic timepiece 10A. FIG. 6 is a timing chart illustrating an operation of the electronic timepiece 10A. Hereinafter, the operation of the electronic timepiece 10A will be described by citing the following case as an example. At a point of time when the operation illustrated in the timing chart of FIGS. 5 and 6 starts (that is, a point of time 0), the secondary battery 130 is in a non-charged state, and the secondary battery 130 is charged with power from the solar panel 135 exposed to sunlight during a period of times 0 to t3 and after time t3. In contrast, during a period of times t3 to t7, the electronic timepiece 10A is left in a dark place, and the secondary battery 130 is not charged.

At a point of time when this operation starts, the secondary battery 130 is not charged. Accordingly, at time 0, the voltage VDD of the secondary battery 130 is lower than an oscillation start voltage VSTA, and the oscillator circuit 301 is in an oscillation stop state. Therefore, the oscillation stop detection circuit 303 outputs the oscillation stop signal S1 in an H-level. Since the oscillation stop signal S1 is in the H-level, the initializing signal SR output from the OR gate 507 is in the H-level, thereby causing the CPU 202 to be initialized by the initializing signal SR.

As described above, during a period of times 0 to t3 in this operation example, the secondary battery 130 is charged with power generated by the solar panel 135, and the voltage VDD of the secondary battery 130 gradually increases. If the voltage VDD reaches the oscillation start voltage VSTA at time t1, the oscillator circuit 301 starts oscillating, and the oscillation stop signal S1 is brought into an L-level. Therefore, the initializing signal SR output from the OR gate 507 is also brought into the L-level, thereby releasing the reset of the CPU 202. However, until the voltage VDD of the secondary battery 130 reaches the second threshold voltage V2, the signal S5 remains in the L-level, and the signal S8 output from the SR latch 505 remains in the H-level. Therefore, the reset circuit 506 outputs the differential signal S10 in synchronization with the clock signal S9 in a cycle T1 (for example, 4 seconds). As a result, the CPU 202 is reset in the cycle T1.

At time t2, the voltage VDD exceeds the second threshold voltage V2. Accordingly, the second voltage detection circuit 503 switches the signal S5 from the L-level to the H-level. In this manner, the SR latch 505 is reset, and the signal S8 is brought into the L-level. The differential signal S10 output from the reset circuit 506 remains in the L-level. This releases cyclic reset of the CPU 202, and the CPU 202 is brought into a normal operation state. Thereafter, the solar panel 135 continues the charging until time t3. Accordingly, the voltage VDD of the secondary battery 130 increases with the lapse of time. During a period from time t3 to time t7, the electronic timepiece 10A is left in the dark place. Therefore, power is not supplied from the solar panel 135 to the secondary battery 130, and the voltage VDD of the secondary battery 130 gradually decreases.

At time t4, it is the time for alarm sounding. If an alarm sounds, the alarm needs a lot of current consumption. Accordingly, due to internal resistance of the secondary battery 130, the power supply voltage VDD temporarily becomes lower than the first threshold voltage V1 over an alarm sounding period. During the alarm sounding period, the signal S6 output from the first voltage detection circuit 501 is brought into an L-level. However, if the alarm sounding period is shorter than time T2, the differential signal S4 is not output from the timer 502, and there is no possibility that the SR latch 505 may be set. Therefore, the CPU 202 maintains the normal operation state. As described above, there is no possibility that the timepiece 10A according to the embodiment may be unnecessarily reset due to the temporarily decreased power supply voltage caused by the alarm sounding.

After the alarm sounding is completed, the power supply voltage VDD of the secondary battery 130 substantially restores a value maintained before the alarm sounds, and thereafter gradually decreases with the lapse of time. Then, if the power supply voltage VDD falls below the first threshold voltage V1 at time t5, the signal S6 output from the first voltage detection circuit 501 is brought into the L-level again, and this state is continuously maintained. At time t6, this state is continuously maintained for a period of T2 or longer. Accordingly, the differential signal S4 is output from the timer 502 to the OR gate 504. The SR latch 505 is set by a signal S11 output from the OR gate 504, and the signal S8 output from the SR latch 505 is brought into the H-level. Since the signal S8 output from the SR latch 505 is in the H-level, the reset circuit 506 outputs the differential signal S10 when the clock signal S9 falls. As a result, the OR gate 507 outputs the initializing signal SR to the CPU 202 in the cycle T1.

Thereafter, until the power supply voltage becomes equal to or higher than the second threshold voltage V2, the CPU 202 is reset in the cycle T1. In this operation example, the electronic timepiece 10A is exposed to sunlight again at time t7, and the secondary battery 130 starts to be recharged. Then, since the power supply voltage restores a voltage which is equal to or higher than the second threshold voltage V2 at time t8, the CPU 202 is normally operated. Until the power supply voltage restores the voltage which is equal to or higher than the second threshold voltage V2 at time t8, the CPU 202 is reset in the cycle T1. Therefore, there is no possibility that the above-described runaway state may continue.

According to the above-described embodiment, it is possible to prevent continuation of a runaway state while avoiding a system from being inadvertently initialized due to the temporarily decreased power supply voltage VDD in the electronic timepiece 10A which uses the secondary battery 130.

B: Second Embodiment

Figure 7:
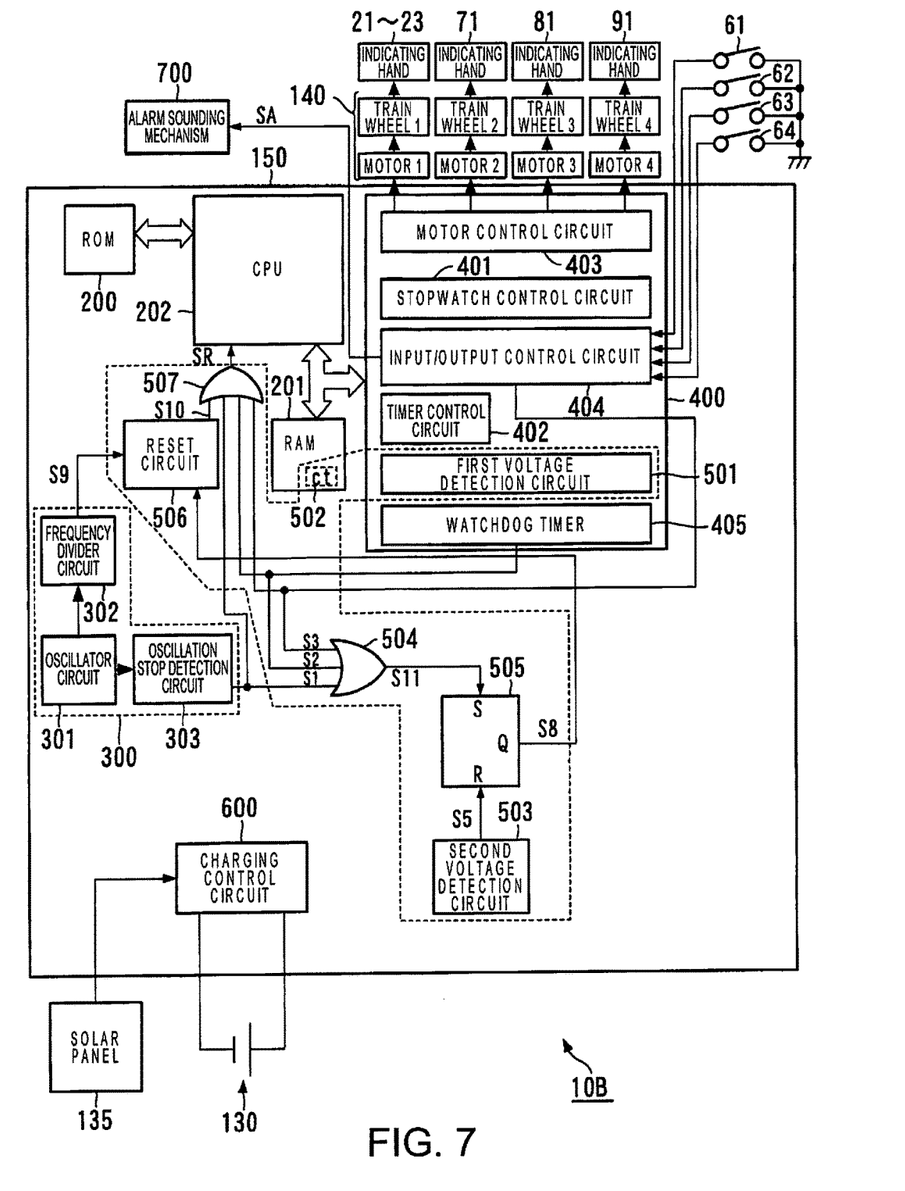
FIG. 7 is a block diagram illustrating an example of an electrical configuration of an electronic timepiece according to a second embodiment of the electronic device according to the invention.

FIG. 7 is a block diagram illustrating an example of an electrical configuration of an electronic timepiece 10B according to a second embodiment of the electronic device according to the invention, that is, a configuration example of a control display unit 150 belonging to the electronic timepiece 10B. The peripheral circuit 400 of the electronic timepiece 10B is realized by a software module, and the first voltage detection circuit 501 is also realized by a software module. This point is different from that of the electronic timepiece 10A. According to the embodiment, as illustrated in FIG. 7, in the electronic timepiece 10B, a counter ct functioning as the timer 502 is realized by a portion of the RAM 201.

Next, similarly to the case of the first embodiment, an operation performed by the CPU 202 of the electronic timepiece 10B will be described by citing the following case as an example. At times 0 to t3 and after time t7, the solar panel 135 is exposed to sunlight, and the secondary battery 130 is charged. During a period of times t3 to t7, the electronic timepiece 10B is left in a dark place, and the secondary battery 130 is not charged. In an operation example to be described below, the secondary battery 130 is not charged at a point of time when the operation starts (that is, at a point of time 0).

Figure 8:
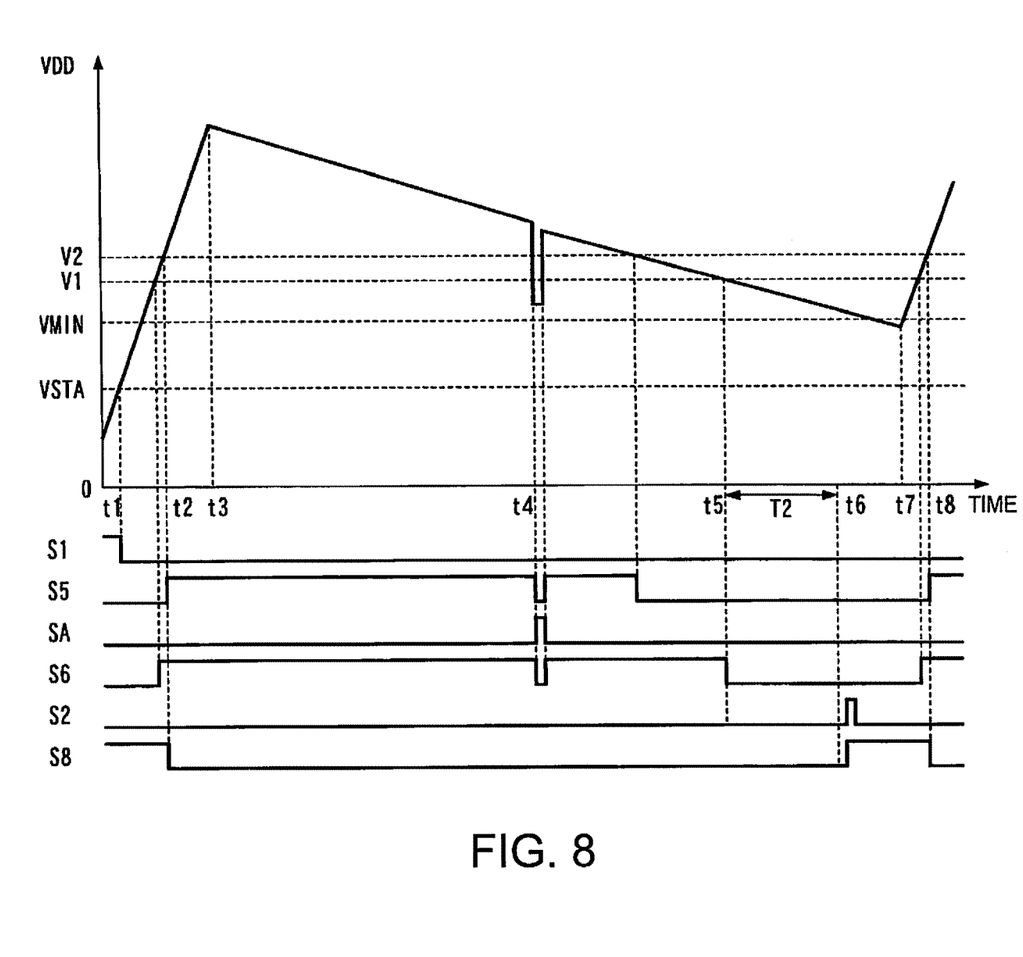
FIG. 8 is a timing chart illustrating an operation of the electronic timepiece.
Figure 9:
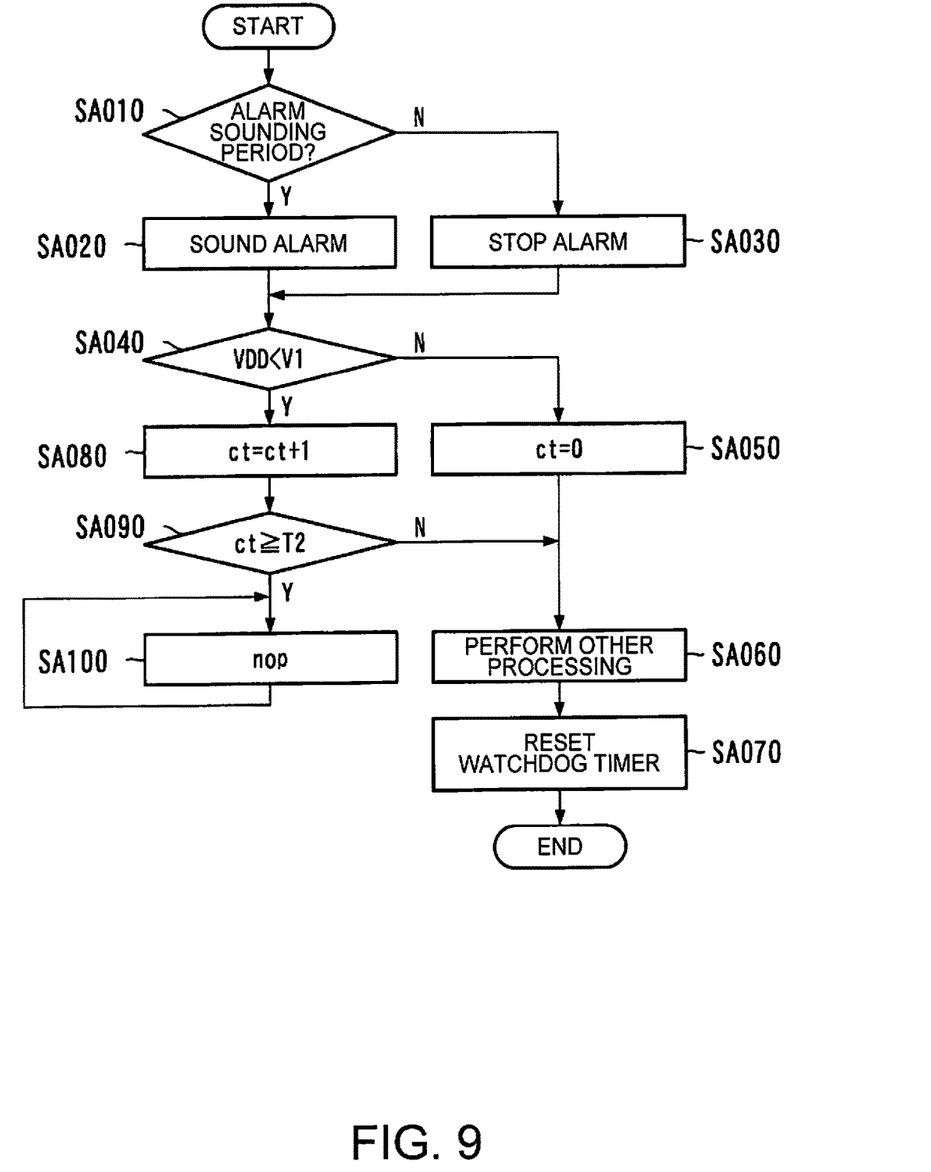
FIG. 9 is a flowchart illustrating a flow of an operation performed by a CPU of the electronic timepiece.

FIG. 8 is a timing chart illustrating the operation of the electronic timepiece 10B. FIG. 9 is a flowchart illustrating a flow of the operation performed by the CPU 202 in a cycle of one second. The signal S6 in FIG. 8 corresponds to a determination result in Step SA040 in FIG. 9. That is, the signal S6 in an H-level means that the determination result in Step SA040 is "No", and the signal S6 in an L-level means that the determination result in Step SA040 is "Yes".

The operation performed before time t4 is the same as that according to the first embodiment, and thus description thereof will be omitted. If it is the time for alarm sounding at time t4, the determination result in Step SA010 in FIG. 9 is "Yes" until the alarm sounding period is subsequently completed, and the alarm sounds (Step SA020). The alarm needs a lot of current consumption. Accordingly, due to internal resistance of the secondary battery 130, the power supply voltage VDD temporarily becomes lower than the second threshold voltage V2 over the alarm sounding period. The determination result in Step SA040 is "Yes", and the CPU 202 causes the counter ct to count up (Step SA080). However, since the alarm sounding period is shorter than T2, the power supply voltage restores a voltage which is equal to or higher than the second threshold voltage V2 before ct≥T2 is satisfied. Therefore, the determination result in Step SA090 performed during the alarm sounding period is always "No", and processes subsequent to Step SA060 are performed. That is, during the alarm sounding period, the CPU 202 resets the counter ct to zero (Step SA050), and performs other processes (Step SA060). Thereafter, the CPU 202 performs a process for resetting the watchdog timer 405 (Step SA070) in a cycle of one second. That is, during a period of ct<T2, the watchdog timer 405 is reset every one second, and the CPU 202 maintains a normal operation state. As described above, there is also no possibility that the electronic timepiece 10B according to the embodiment may be unnecessarily reset due to the temporarily decreased power supply voltage caused by the alarm sounding.

In a case of time t5, the voltage VDD becomes lower than the first threshold voltage V1. Accordingly, the counter ct starts to count up again, and ct=T2 is satisfied at time t6. Thereafter, the CPU 202 repeatedly performs a no-operation (NOP) instruction (Step SA100), and no longer resets the watchdog timer 405. The watchdog timer 405 outputs the differential signal S2 after 3 seconds from when time measurement starts. The OR gate 504 receiving the differential signal S2 supplies the signal S11 in an H-level to the SR latch 505. The SR latch 505 is set by the signal S11 output from the OR gate 504, and the signal S8 output from the SR latch 505 is brought into the H-level. Since the signal S8 output from the SR latch 505 is in the H-level, the reset circuit 506 outputs the differential signal S10 when the clock signal S9 falls, thereby resetting the CPU 202. The subsequent operations are the same as those according to the first embodiment.

As described above, according to the embodiment, it is also possible to prevent a system from running away due to a continuing state where a charging current falls below a consumed current, while avoiding the system from being inadvertently initialized due to a temporarily decreased voltage in the electronic device which uses the secondary battery.

C: Modification Example

Hitherto, the first and second embodiments according to the invention have been described. However, as a matter of course, modification examples to be described below may be added to the embodiments.

(1) A function of the electronic timepiece 10A (or the electronic timepiece 10B) may be partially stopped in response to a starting point where the voltage VDD of the secondary battery 130 falls below the first threshold voltage V1. Specifically, a function which needs a large amount of power consumption such as the alarm sounding function in the above-described embodiments is stopped in response to the starting point where the voltage VDD of the secondary battery 130 falls below the first threshold voltage V1. If the function which needs a large amount of power consumption is operated in a state where the voltage VDD of the secondary battery 130 falls below the first threshold voltage V1, the time required until the power supply voltage VDD of the secondary battery 130 falls below the operation-guaranteed voltage VMIN after falling below the first threshold voltage V1 becomes shorter than T2, thereby causing a possibility that the CPU 202 may not be prevented from running away. According to the embodiment, it is possible to prevent a runaway state of the CPU 202 which is caused by a heavy load.

In addition, in order to reliably ensure that the time required until the voltage VDD of the secondary battery 130 falls below the operation-guaranteed voltage VMIN after falling below the first threshold voltage V1 does not become shorter than T2, a function of the electronic timepiece may be partially stopped in response to a starting point where the voltage VDD of the secondary battery 130 falls below a third threshold voltage V3 which is set to be higher than the first threshold voltage V1. Depending on a function of the electronic timepiece, even when the voltage VDD of the secondary battery 130 exceeds the first threshold voltage V1 at a point of time when the operation starts, there is a possibility that the voltage VDD of the secondary battery 130 may rapidly decrease due to the power consumed by the function and the time required until the voltage VDD falls below the operation-guaranteed voltage VMIN may become shorter than T2. For this reason, the function of the electronic timepiece is partially stopped by allowing room for the voltage VDD of the secondary battery 130.

(2) A threshold voltage (fourth threshold voltage) employed when the electronic timepiece 10A (or the electronic timepiece 10B) starts to be operated or after a system is initialized may be set. When the electronic timepiece starts to be operated or after the system is initialized, the initializing unit may be caused to perform a process for cyclically outputting the initializing signal SR until the voltage VDD of the secondary battery 130 increases and exceeds the fourth threshold voltage. As a matter of course, it is also necessary to set the fourth threshold voltage to be higher than the operation-guaranteed voltage VMIN of the controller. The fourth threshold voltage may be different from any one of the first threshold voltage V1 and the second threshold voltage V2, or may be equal to at least any one of the first threshold voltage V1 and the second threshold voltage V2. As long as a mode is adopted so that the fourth threshold voltage V4 is set to be equal to at least any one of the first threshold voltage V1 and the second threshold voltage V2, labor needed to set the threshold voltages can be reduced, and the manufacturing cost for the electronic timepiece 10A (or the electronic timepiece 10B) can be reduced. In addition, if the fourth threshold voltage V4 is set to be different from the second threshold voltage V2, whether or not the controller needs to be initialized can be flexibly determined by using different threshold voltages for a voltage increasing phase and the subsequent voltage increasing phase when the operation starts or after the system is initialized.

(3) In the above-described respective embodiments, a case has been described in which the initializing unit is caused to start a process for outputting the initializing signal SR in a constant cycle in response to a starting point where the voltage VDD of the secondary battery 130 becomes equal to or lower than the first threshold voltage V1 and the state continues for a predetermined period of time. However, an output interval of the initializing signal SR may be changed in accordance with the voltage VDD or a fluctuation width of the voltage VDD. For example, as there is a great difference between the voltage VDD and the second threshold voltage V2, a mode is conceivable in which the output interval of the initializing signal SR is shortened. As a decreasing width per unit time is large in a decreasing phase of the voltage VDD, a mode is conceivable in which the output interval of the initializing signal SR is shortened. On the other hand, as an increasing width per unit time is large in an increasing phase (or when power supply from the solar panel 135 to the secondary battery 130 is detected) of the voltage VDD, a mode is conceivable in which the output interval of the initializing signal SR is lengthened.

According to the mode in which the output interval of the initializing signal SR is shortened as there is a great difference between the voltage VDD and the second threshold voltage V2, or the mode in which the output interval of the initializing signal SR is shortened as the decreasing width per unit time in the voltage VDD is large, it is possible to prevent a runaway state from occurring due to omitted initialization. In addition, according to the mode in which the output interval of the initializing signal SR is lengthened as the increasing width per unit time in the voltage VDD is large, it is possible to expect that a normal operation state is restored earlier while unnecessary initializing is avoided. In short, any mode may be adopted in which the initializing unit is caused to perform a process for outputting the initializing signal SR at predetermined timing in response to a starting point where the voltage VDD becomes equal to or lower than the first threshold voltage V1 and the state continues for a predetermined period of time.

Figure 10:
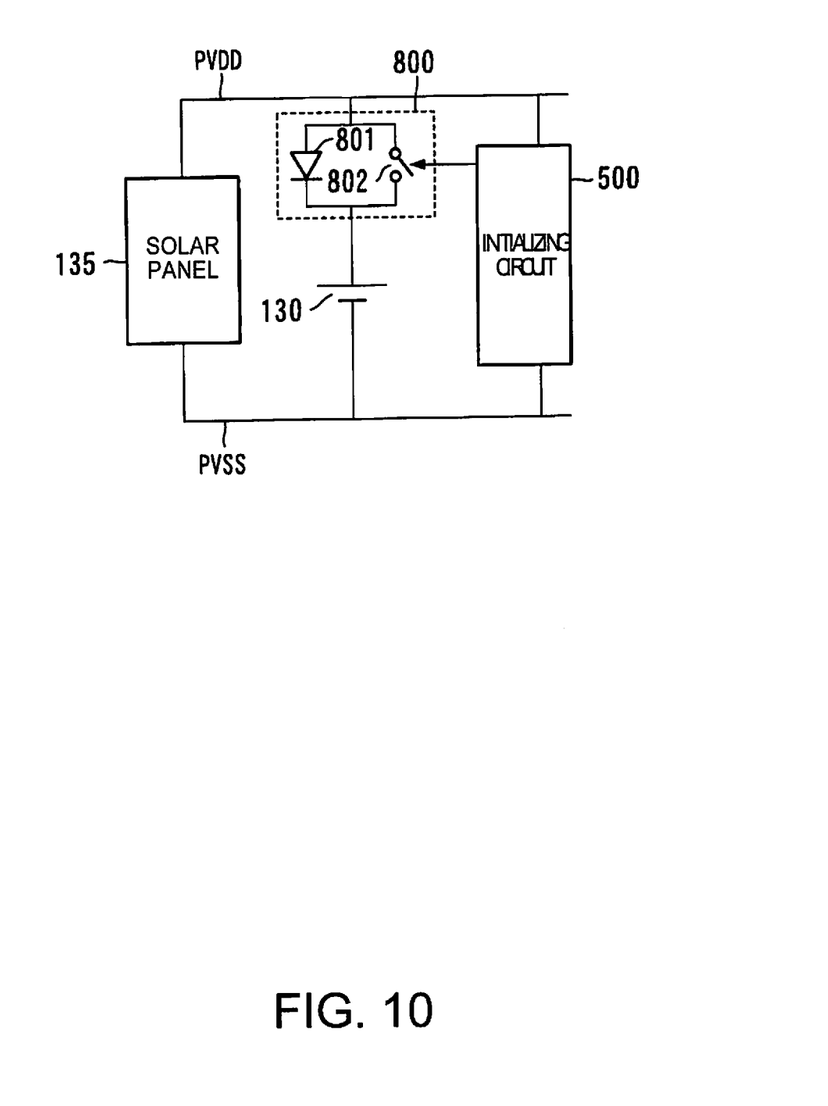
FIG. 10 is a view for describing a modification example.

(4) In addition, in order to realize that a normal operation is restored earlier, a quick start circuit 800 illustrated in FIG. 10 may be provided. The quick start circuit 800 includes a voltage generator 801 and a switch 802 which are interposed and inserted in parallel between the former of a high-potential side power supply line PVDD connected to a high-potential side output terminal of the solar panel 135 and a low-potential side power supply line PVSS connected to a low-potential side output terminal of the solar panel 135, and a high-potential side terminal of the secondary battery 130. The high-potential side power supply line PVDD and the low-potential side power supply line PVSS supply operation power from the secondary battery 130 to the CPU 202 and the peripheral circuit 400.

For example, the voltage generator 801 is a diode, and the switch 802 is a transistor switch which is switched to be turned on and off by the initializing unit. In this modification example, whereas the initializing unit turns off the switch 802 in response to a starting point where the outputting of the initializing signal SR starts, the initializing unit turns on the switch 802 in response to a starting point where the outputting of the initializing signal SR stops. In addition, in this modification example, the second voltage detection circuit 503 compares the voltage of the secondary battery 130 with the second threshold voltage V2, in such a way that a potential difference between the high-potential side power supply line PVDD and the low-potential side power supply line PVSS is regarded as the voltage of the secondary battery 130.

The potential difference between the high-potential side power supply line PVDD and the low-potential side power supply line PVSS coincides with the voltage of the high-potential side terminal of the secondary battery 130 in a state where the switch 802 is turned on, and coincides with a voltage obtained by adding a voltage generated by the voltage generator 801 (voltage corresponding to voltage decreased by a diode) to the voltage of the high-potential side terminal of the secondary battery 130 in a state where the switch 802 is turned off. That is, in this case, the second threshold voltage V2 and a comparison-target voltage are increased by the voltage generator 801. Therefore, it is possible to shorten the time required until a normal operation is restored.

(5) In the above-described respective embodiments, an example has been described in which the invention is applied to the multi-functional alarm-installed solar timepiece. However, an application target of the invention is not limited to the multi-functional alarm-installed solar timepiece. For example, in the above-described respective embodiments, the solar panel 135 is used as a charging unit for charging the secondary battery 130. However, a manually operated generator which generates power in accordance with the rotation of the crown 50 or an automatically operated generator may be used as the above-described charging unit. In addition, without being limited to the electronic timepiece, the invention may be applied to a smartphone or a tablet terminal. In short, the invention is applicable as long as the electronic device includes the secondary battery.

The entire disclosure of Japanese Patent Application No. 2015-063355, filed Mar. 25, 2015 is expressly incorporated by reference herein.

What is claimed is:
1. An electronic device comprising:
   a secondary battery;
   a controller that receives power supply from the secondary battery so as to perform a drive control on one or other multiple circuits which are driven by receiving the power supply from the secondary battery; and
   an initializing unit that starts processing for outputting an initializing signal to instruct the controller to perform initializing at predetermined timing in response to detecting that a low voltage state in which a voltage of the secondary battery is equal to or lower than a first threshold voltage which is set to be higher than an operation-guaranteed voltage of the controller continues for a predetermined period of time subsequent to detecting that the voltage of the secondary battery becomes equal to or lower than the first threshold voltage, the initializing unit stopping the outputting of the initializing signal in response to detecting that the voltage of the secondary battery becomes equal to or higher than a second threshold voltage which is set to be higher than the operation-guaranteed voltage of the controller.

2. The electronic device according to claim 1, wherein the first threshold voltage is equal to the second threshold voltage.

3. The electronic device according to claim 1, wherein the controller stops driving of a predetermined circuit within one or other multiple circuits, in response to a starting point in which the voltage of the secondary battery falls below the first threshold voltage, or falls below a third threshold voltage which is set to be higher than the first threshold voltage.

4. The electronic device according to claim 1, wherein the initializing unit performs processing for outputting the initializing signal at predetermined timing, when the electronic device starts to be operated or after a system is initialized, until the voltage of the secondary battery rises over a fourth threshold voltage which is set to be higher than the operation-guaranteed voltage of the controller.

5. The electronic device according to claim 4, wherein the fourth threshold voltage is equal to at least one of the first threshold voltage and the second threshold voltage.

6. The electronic device according to claim 1, wherein the predetermined period of time is set to be shorter than a period of time during which the voltage of the secondary battery decreases from the first threshold voltage to the operation-guaranteed voltage, when the electronic device is operated in a state where power is not supplied to the secondary battery.

7. The electronic device according to claim 1, further comprising:
a watchdog timer that initializes a system in response to a starting point where a predetermined time is measured,
wherein whereas the initializing unit resets time measurement of the watchdog timer at predetermined timing when the voltage of the secondary battery is higher than the first threshold voltage, the initializing unit suspends the resetting for the time measurement of the watchdog timer, when a state where the voltage of the secondary battery becomes equal to or lower than the first threshold voltage continues for the predetermined period of time or longer.

8. An electronic device comprising:
a secondary battery;
a controller that receives power supply from the secondary battery so as to perform a drive control on one or other multiple circuits which are driven by receiving the power supply from the secondary battery;
an initializing unit that starts processing for outputting an initializing signal to instruct the controller to perform initializing at predetermined timing, in response to a starting point in which a voltage of the secondary battery becomes equal to or lower than a first threshold voltage which is set to be higher than an operation-guaranteed voltage of the controller and a lower state thereof continues for a predetermined period of time, and that stops the outputting of the initializing signal, in response to a starting point in which the voltage of the secondary battery becomes equal to or higher than a second threshold voltage which is set to be higher than the operation-guaranteed voltage of the controller; and
a voltage generator and a switch which are interposed and inserted in parallel between the former of high-potential side and low-potential side power supply lines for supplying power to the one or other multiple circuits and the controller, and a high-potential side terminal of the secondary battery,
wherein whereas the initializing unit turns off the switch in response to a starting point where the outputting of the initializing signal starts, the initializing unit turns on the switch in response to a starting point where the outputting of the initializing signal stops, and compares the voltage of the secondary battery with the second threshold voltage, in such a way that a potential difference between the high-potential side and the low-potential side power supply lines is regarded as the voltage of the secondary battery.

9. A method of initializing a controller in an electronic device which has a secondary battery, one or other multiple circuits driven by receiving power supply from the secondary battery, and the controller for performing a drive control on the one or other multiple circuits by receiving the power supply from the secondary battery, the method comprising:
starting processing for outputting an initializing signal to instruct the controller to perform initializing at predetermined timing in response to detecting that a low voltage state in which a voltage of the secondary battery is equal to or lower than a first threshold voltage which is set to be higher than an operation-guaranteed voltage of the controller continues for a predetermined period of time subsequent to detecting that the voltage of the secondary battery becomes equal to or lower than the first threshold voltage; and
stopping the outputting of the initializing signal in response to detecting that the voltage of the secondary battery becomes equal to or higher than a second threshold voltage which is set to be higher than the operation-guaranteed voltage of the controller.

* * * * *